(12) United States Patent
Yamagishi et al.

(10) Patent No.: US 12,033,833 B2
(45) Date of Patent: Jul. 9, 2024

(54) FILTER CIRCUIT AND PLASMA PROCESSING APPARATUS

(71) Applicant: Tokyo Electron Limited, Tokyo (JP)

(72) Inventors: Koji Yamagishi, Miyagi (JP); Yuji Aota, Miyagi (JP); Koichi Nagami, Miyagi (JP); Kota Ishiharada, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 351 days.

(21) Appl. No.: 17/587,189

(22) Filed: Jan. 28, 2022

(65) Prior Publication Data

US 2022/0246400 A1    Aug. 4, 2022

(30) Foreign Application Priority Data

Feb. 1, 2021  (JP) ................................. 2021-014287

(51) Int. Cl.
    *H01J 37/32* (2006.01)
(52) U.S. Cl.
    CPC .. *H01J 37/32183* (2013.01); *H01J 37/32577* (2013.01); *H01J 37/32651* (2013.01); *H01J 2237/334* (2013.01)
(58) Field of Classification Search
    None
    See application file for complete search history.

(56) References Cited

U.S. PATENT DOCUMENTS

| | | | | |
|---|---|---|---|---|
| 6,072,147 A | * | 6/2000 | Koshiishi | H01J 37/32174 216/68 |
| 6,238,588 B1 | * | 5/2001 | Collins | H01L 21/02063 438/719 |
| RE37,375 E | * | 9/2001 | Satoh | H03H 9/6436 333/194 |
| RE37,790 E | * | 7/2002 | Satoh | H03H 9/6436 333/133 |
| 6,431,112 B1 | * | 8/2002 | Sill | H01J 37/32174 118/723 R |
| 6,514,376 B1 | * | 2/2003 | Collins | H01J 37/32165 118/724 |
| 6,967,305 B2 | * | 11/2005 | Sellers | H01J 37/32935 219/121.36 |

(Continued)

FOREIGN PATENT DOCUMENTS

GB        2486343 A  *  6/2012  ........... A61B 18/042
JP      2006-270017 A     10/2006

*Primary Examiner* — Srinivas Sathiraju
(74) *Attorney, Agent, or Firm* — Nath, Goldberg & Meyer; Jerald L. Meyer; Tanya E. Harkins (57) ABSTRACT

There is provided a radio frequency power filter circuit used in a plasma processing apparatus that includes an electrode and a feeding body connected to a center of a rear surface of the electrode and generates plasma by applying radio frequency power, the filter circuit including a series resonance circuit provided in a wiring line between a conductive member provided in the plasma processing apparatus and a power supply configured to supply DC power or power having a frequency of less than 400 kHz to the conductive member, and including a coil connected in series to the wiring line and a capacitor connected between the wiring line and a ground. A central axis of the coil and a central axis of the feeding body coincide with each other.

19 Claims, 11 Drawing Sheets

(56) References Cited

U.S. PATENT DOCUMENTS

| | | | | |
|---|---|---|---|---|
| RE40,036 E | * | 1/2008 | Satoh | H03H 9/6483 |
| | | | | 333/133 |
| 7,532,322 B2 | * | 5/2009 | Koshimizu | H01L 21/31116 |
| | | | | 356/316 |
| 7,582,182 B2 | * | 9/2009 | Matsumoto | H01J 37/32935 |
| | | | | 156/345.24 |
| 7,780,814 B2 | * | 8/2010 | Pipitone | H01J 37/321 |
| | | | | 156/345.46 |
| 7,859,080 B2 | * | 12/2010 | Kuwajima | H01L 27/016 |
| | | | | 257/532 |
| 9,333,034 B2 | * | 5/2016 | Hancock | A61B 18/042 |
| 10,090,160 B2 | * | 10/2018 | Mori | H01J 37/32706 |
| 11,812,539 B2 | * | 11/2023 | Biloiu | H05H 7/02 |
| 2003/0094239 A1 | * | 5/2003 | Quon | H01J 37/32082 |
| | | | | 118/728 |
| 2005/0278020 A1 | * | 12/2005 | Wang | A61K 49/1818 |
| | | | | 623/1.44 |
| 2007/0006972 A1 | * | 1/2007 | Piptone | H01J 37/32174 |
| | | | | 438/689 |
| 2007/0132060 A1 | * | 6/2007 | Kuwajima | H01L 27/016 |
| | | | | 257/530 |
| 2008/0179948 A1 | * | 7/2008 | Nagarkatti | H03F 3/195 |
| | | | | 307/18 |
| 2008/0316773 A1 | * | 12/2008 | Neubarth | H02M 3/3384 |
| | | | | 363/21.02 |
| 2009/0165954 A1 | * | 7/2009 | Kuthi | H01J 37/32623 |
| | | | | 156/345.43 |
| 2013/0267943 A1 | * | 10/2013 | Hancock | H05B 6/806 |
| | | | | 606/33 |
| 2014/0305905 A1 | * | 10/2014 | Yamada | H01J 37/32568 |
| | | | | 156/345.28 |
| 2014/0361690 A1 | * | 12/2014 | Yamada | H01J 37/32183 |
| | | | | 315/111.21 |
| 2015/0096684 A1 | * | 4/2015 | Nagami | H01J 37/32174 |
| | | | | 156/345.28 |
| 2016/0057843 A1 | * | 2/2016 | Pickett | H05B 41/38 |
| | | | | 315/291 |
| 2016/0079038 A1 | * | 3/2016 | Okunishi | H01J 37/32798 |
| | | | | 315/111.21 |
| 2016/0086772 A1 | * | 3/2016 | Khaja | H01J 37/3211 |
| | | | | 315/111.21 |
| 2017/0162417 A1 | * | 6/2017 | Ye | H01L 21/6833 |
| 2017/0353172 A1 | * | 12/2017 | Zhao | H03H 7/175 |
| 2017/0372870 A1 | * | 12/2017 | Godyak | H01J 37/3211 |
| 2018/0041183 A1 | * | 2/2018 | Mavretic | H01L 21/02274 |
| 2019/0108976 A1 | * | 4/2019 | Van Zyl | H01J 37/32146 |
| 2019/0267212 A1 | * | 8/2019 | Mavretic | H03F 3/24 |
| 2019/0304754 A1 | * | 10/2019 | Shim | H01J 37/32642 |
| 2019/0318915 A1 | * | 10/2019 | Nagami | H01J 37/32091 |
| 2019/0333739 A1 | * | 10/2019 | Nagami | H01L 21/32136 |
| 2020/0381215 A1 | * | 12/2020 | Koshimizu | H01J 37/32183 |
| 2021/0040789 A1 | * | 2/2021 | Rozbicki | G02F 1/163 |
| 2021/0043472 A1 | * | 2/2021 | Koshimizu | H01J 37/32045 |
| 2021/0050185 A1 | * | 2/2021 | Martinez | H01J 37/32155 |
| 2021/0159049 A1 | * | 5/2021 | Kubota | H01J 37/32174 |
| 2021/0183631 A1 | * | 6/2021 | Yamagishi | H01J 37/32834 |
| 2021/0287879 A1 | * | 9/2021 | Yamagishi | H01J 37/32449 |
| 2021/0332931 A1 | * | 10/2021 | Hoshi | H01L 21/67017 |
| 2022/0020576 A1 | * | 1/2022 | Torii | H01J 37/32715 |
| 2022/0208518 A1 | * | 6/2022 | Long | H01J 37/32091 |
| 2022/0246400 A1 | * | 8/2022 | Yamagishi | H01J 37/32183 |
| 2022/0255351 A1 | * | 8/2022 | Rozbicki | E06B 9/24 |
| 2023/0124350 A1 | * | 4/2023 | Biloiu | H05H 9/00 |
| | | | | 315/505 |
| 2023/0260766 A1 | * | 8/2023 | Torii | H01J 37/32091 |
| | | | | 315/111.21 |
| 2024/0032183 A1 | * | 1/2024 | Biloiu | H05H 9/00 |

* cited by examiner

FILTER CIRCUIT AND PLASMA PROCESSING APPARATUS

CROSS-REFERENCE TO RELATED APPLICATION

This application is based upon and claims the benefit of priority from Japanese Patent Application No. 2021-014287, filed on Feb. 1, 2021, the entire contents of which are incorporated herein by reference.

TECHNICAL FIELD

The present disclosure relates to a filter circuit and a plasma processing apparatus.

BACKGROUND

For example, Patent Document 1 proposes a plasma processing apparatus that superimposes a direct current (DC) voltage through a filter when a radio frequency (RF) power for plasma generation is applied to an upper electrode.

PRIOR ART DOCUMENT

Patent Document

Patent Document 1: Japanese Laid-Open Patent Publication No. 2006-270017

SUMMARY

According to embodiments of the present disclosure, there is provided a radio frequency power filter circuit used in a plasma processing apparatus that includes an electrode and a feeding body connected to a center of a rear surface of the electrode and generates plasma by applying radio frequency power, the filter circuit comprising a series resonance circuit provided in a wiring line between a conductive member provided in the plasma processing apparatus and a power supply configured to supply DC power or power having a frequency of less than 400 kHz to the conductive member, and including a coil connected in series to the wiring line and a capacitor connected between the wiring line and a ground. A central axis of the coil and a central axis of the feeding body coincide with each other.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In each of the drawings, the same components are denoted by the same reference numerals, and redundant descriptions thereof may be omitted.

Hereinbelow, a configuration example of a plasma processing system will be described.

[Plasma Processing System]

Figure 1:
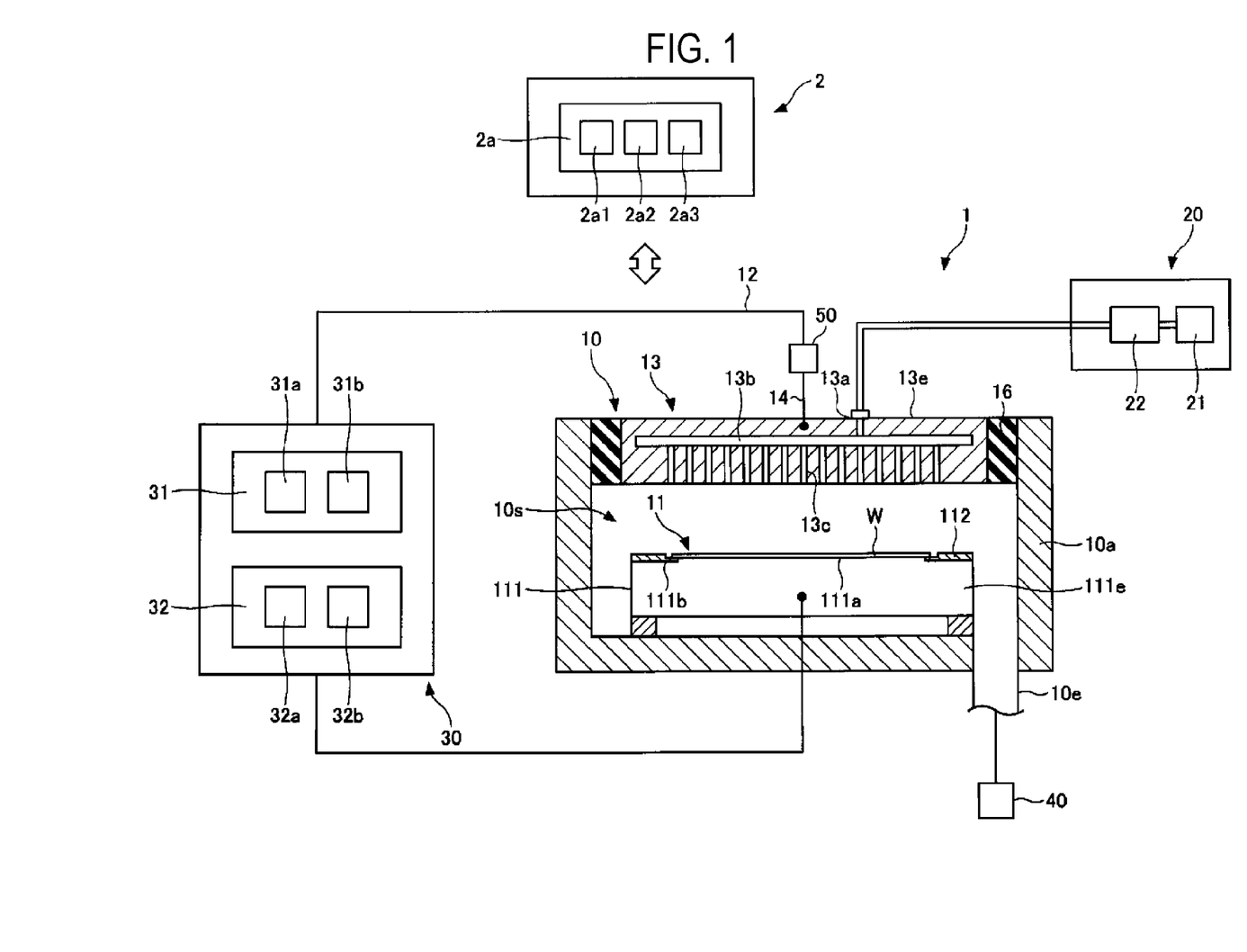
FIG. 1 is a view illustrating an example of a plasma processing system including a plasma processing apparatus according to an embodiment.

A plasma processing system includes a capacitively coupled plasma processing apparatus 1 and a controller 2. The capacitively coupled plasma processing apparatus 1 includes a plasma processing chamber 10, a gas supplier 20, a power supply 30, and an exhaust system 40. In addition, the plasma processing apparatus 1 includes a substrate support 11 and a gas introduction part. The gas introduction part is configured to introduce at least one processing gas into the plasma processing chamber 10. The gas introduction part includes a shower head 13. The substrate support 11 is arranged in the plasma processing chamber 10. The shower head 13 is arranged above the substrate support 11. In an embodiment, the shower head 13 constitutes at least a portion of the ceiling of the plasma processing chamber 10. The plasma processing chamber 10 includes a plasma processing space 10s defined by the shower head 13, the side wall 10a of the plasma processing chamber 10, and the substrate support 11. In addition, the plasma processing chamber 10 includes at least one gas supply port configured to supply at least one processing gas to the plasma processing space 10s, and at least one gas discharge port configured to discharge gas from the plasma processing space. The side wall 10a is grounded. The shower head 13 and the plasma processing chamber 10 are insulated from each other by an insulating member 16. The shower head 13 and the substrate support 11 are electrically insulated from the plasma processing chamber 10 housing.

The substrate support 11 includes a main body 111 and a ring assembly 112. The main body 111 includes a central region (a substrate support surface) 111a configured to support a substrate (wafer) W and an annular region (a ring support surface) 111b configured to support a ring assembly 112. The annular region 111b of the main body 111 surrounds the central region 111a of the main body 111 in a plan view. The substrate W is placed on the central region 111a of the main body 111, and the ring assembly 112 is disposed on the annular region 111b of the main body 111 to surround the substrate W on the central region 111a of the main body 111. In the embodiment, the main body 111 includes a base and an electrostatic chuck. The base includes a conductive member 111e. The conductive member 111e of the base functions as a lower electrode. The electrostatic chuck is placed on the base. The top surface of the electrostatic chuck has a substrate support surface 111a. The ring assembly 112 includes one or more annular members. At least one of the one or more annular members is an edge ring. Although not illustrated, the substrate support 11 may include a temperature regulation module configured to regulate at least one of the electrostatic chuck, the ring assembly 112, and a substrate to a target temperature. The temperature regulation module may include a heater, a heat transfer medium, a flow path, or a combination thereof. A heat transfer fluid, such as brine or gas, flows through the flow path. The substrate support 11 may include a heat transfer gas supplier configured to supply a heat transfer gas to the space between the rear surface of the substrate W and the substrate support surface 111a.

The shower head 13 is configured to introduce at least one processing gas from the gas supplier 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. In addition, the shower head 13 includes a conductive member 13e. The conductive member 13e of the shower head 13 functions as an upper electrode. In addition to the shower head 13, the gas introduction part may include one or more side gas injectors (SGIs) installed in one or more openings formed in the side wall 10a.

The gas supplier 20 may include at least one gas source 21 and at least one flow rate controller 22. In the embodiment, the gas supplier 20 is configured to supply at least one processing gas from a corresponding gas source 21 to the shower head 13 via a corresponding flow rate controller 22. Each flow rate controller 22 may include, for example, a mass flow controller or a pressure-controlled flow rate controller. In addition, the gas supplier 20 may include at least one flow rate modulation device configured to modulate or pulse the flow rates of one or more processing gases.

The power supply 30 includes an RF power supply 31 coupled to the plasma processing chamber 10 via at least one impedance matching circuit. The RF power supply 31 is configured to supply at least one RF signal (RF power) such as a source RF signal and a bias RF signal to the conductive member 111e of the substrate support 11 and/or the conductive member 13e of the shower head 13. As a result, plasma is formed from the at least one processing gas supplied to the plasma processing space 10s. Therefore, the RF power supply 31 may function as at least a part of a plasma generation part configured to generate plasma from one or more processing gases in the plasma processing chamber 10. By supplying the bias RF signal to the conductive member 111e of the substrate support 11, a bias potential is generated in a substrate W, and an ionic component in the formed plasma can be drawn into the substrate W.

In the embodiment, the RF power supply 31 includes a first RF generator 31a and a second RF generator 31b. The first RF generator 31a is coupled to the conductive member 111e of the substrate support 11 and/or the conductive member 13e of the shower head 13 via at least one impedance matching circuit, and is configured to generate a source RF signal (source RF power) for plasma generation. In one embodiment, the source RF signal has a frequency in the range of 13 MHz to 150 MHz. In one embodiment, the first RF generator 31a may be configured to generate multiple source RF signals having different frequencies. The generated one or more source RF signals are supplied to the conductive member 111e of the substrate support 11 and/or the conductive member 13e of the shower head 13. The second RF generator 31b is coupled to the conductive member 111e of the substrate support 11 via at least one impedance matching circuit, and is configured to generate a bias RF signal (bias RF power). In an embodiment, the bias RF signal has a lower frequency than the source RF signal. In an embodiment, the bias RF signal has a frequency in the range of 400 kHz to 13.56 MHz. In an embodiment, the second RF generator 31b may be configured to generate multiple bias RF signals having different frequencies. The generated one or more bias RF signals are supplied to the conductive member 111e of the substrate support 11. In addition, in various embodiments, at least one of the source RF signal and the bias RF signal may be pulsed.

In the present embodiment, the source RF signal applies power having a frequency of 100 MHz to the conductive member 13e of the shower head 13 in the plasma processing apparatus 1. In the present embodiment, the bias RF signal applies power having a frequency of 13 MHz to the conductive member 111e of the substrate support 11 in the plasma processing apparatus 1. However, the present disclosure is not limited thereto.

The power supply 30 may include a DC power supply 32 coupled to the plasma processing chamber 10. The DC power supply 32 includes a first DC generator 32a and a second DC generator 32b. In an embodiment, the first DC generator 32a is connected to the conductive member 111e of the substrate support 11 and is configured to generate a first DC signal. The generated first bias DC signal is applied to the conductive member 111e of the substrate support 11. In an embodiment, the first DC signal may be applied to another electrode such as an electrode in an electrostatic chuck. In an embodiment, the second DC generator 32b is connected to the conductive member 13e of the shower head 13 and is configured to generate a second DC signal. The generated second DC signal is applied to the conductive member 13e of the shower head 13. In various embodiments, at least one of the first and second DC signals may be pulsed. The first and second DC generators 32a and 32b may be provided separately from the RF power supply 31, or the first DC generator 32a may be provided in place of the second RF generator 31b. In order to apply the voltage of a DC component to the shower head 13, power having a frequency of less than 400 kHz may be applied instead of the second DC generator 32b.

The exhaust system 40 may be connected to, for example, a gas discharge port 10e provided in the bottom portion of the plasma processing chamber 10. The exhaust system 40 may include a pressure regulation valve and a vacuum pump. By the pressure regulation valve, the pressure in the plasma processing space 10s is regulated. The vacuum pump may include a turbo molecular pump, a dry pump, or a combination thereof.

A filter circuit 50 is provided in the wiring line 12 between the conductive member 13e and the power supply 30 that supplies DC power (the second DC signal) to the conductive member 13e. In addition, the filter circuit 50 is connected to a feeding body 14 connected to the central portion of the rear surface of the shower head 13. As will be described later, the filter circuit 50 has a filter function of trapping a radio frequency as a source RF signal from the first RF generator 31a.

The controller 2 processes computer-executable commands that cause the plasma processing apparatus 1 to execute various processes described in the present disclosure. The controller 2 may be configured to control each element of the plasma processing apparatus 1 to perform various steps described herein. In an embodiment, a part or all of the controller 2 may be included in the plasma processing apparatus 1. The controller 2 may include, for example, a computer 2a. The computer 2a may include, for example, a processing unit (a central processing unit (CPU)) 2a1, a storage part 2a2, and a communication interface 2a3. The processing part 2a1 may be configured to perform various control operations based on programs stored in the storage part 2a2. The storage part 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

[Filter Circuit]

Next, filter circuits 50 and 150 will be described with reference to FIGS. 2A and 2B. FIG. 2C illustrates an example of a singular point of plasma density in the plasma processing space 10s when a filter circuit 150 is provided at the position of FIG. 2A of the wiring line 12. FIG. 2D illustrates an example of a singular point of plasma density in the plasma processing space 10s when a filter circuit 50 is provided at the position of FIG. 2B of the wiring line 12.

Figure 2A:
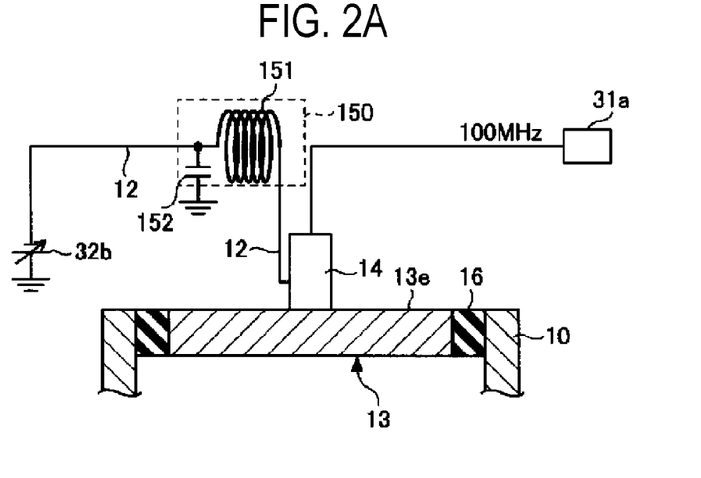
FIGS. 2A to 2D are views illustrating examples of a configuration of a filter circuit of an embodiment and singular points of plasma density.
Figure 2B:
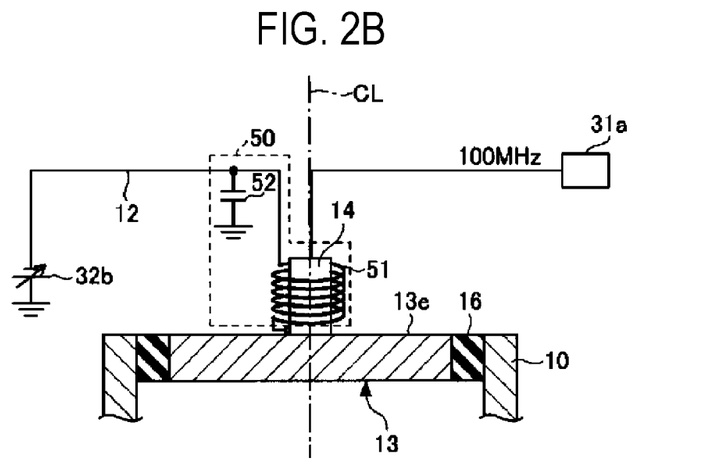
Figure 2C:
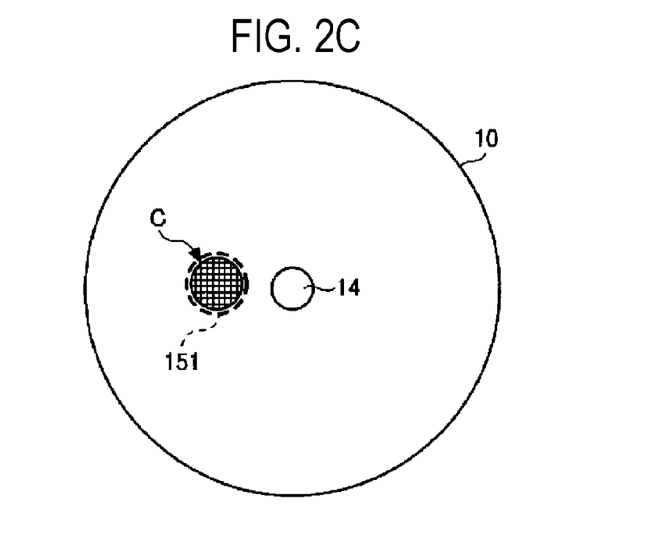
Figure 2D:
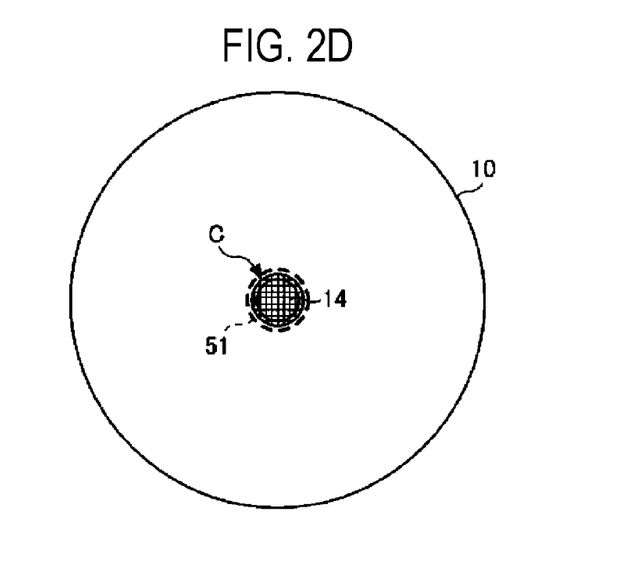

As illustrated in FIGS. 2A and 2B, radio frequency power as a source RF signal is applied to the shower head 13 from the first RF generator 31a via the feeding body 14 connected to the central portion of the rear surface of the shower head 13.

The filter circuit 150 illustrated in FIG. 2A is arranged in the wiring line 12 between the conductive member 13e provided in the plasma processing apparatus 1 and the second DC generator 32b that supplies DC power to the conductive member 13e. As a result, the DC power from the second DC generator 32b is supplied to the feeding body 14 via the filter circuit 150.

The filter circuit 150 is a series resonance circuit having a coil 151 connected in series with the wiring line 12 and a capacitor 152 connected between the wiring line 12 between the second DC generator 32b and the coil 151, and the ground. By this configuration of the filter circuit 150, a radio frequency as a source RF signal from the first RF generator 31a is trapped.

Similarly, the filter circuit 50 illustrated in FIG. 2B is arranged in the wiring line 12 between the conductive member 13e provided in the plasma processing apparatus 1 and the second DC generator 32b that supplies DC power to the conductive member 13e. As a result, the DC power from the second DC generator 32b is supplied to the feeding body 14 via the filter circuit 50.

The filter circuit 50 is a series resonance circuit having a coil 51 connected in series with the wiring line 12 and a capacitor 52 connected between the wiring line 12 between the second DC generator 32b and the coil 51, and the ground. By this configuration of the filter circuit 50, a radio frequency as a source RF signal from the first RF generator 31a is trapped. The filter circuit 50 may be provided inside the matcher or may be provided outside the matcher.

The first RF generator 31a may apply power having a frequency of 100 MHz or higher to the shower head 13 via the feeding body 14. As described above, in a case where a radio frequency having a frequency of 100 MHz or higher is applied to the feeding body 14, since the wiring line 12 from the feeding body 14 to the filter circuit 150 is long in the configuration of FIG. 2A, the inductance (L component) and stray capacitance (C component) of the wiring line 12 increase. As a result, a bias in plasma density distribution may occur due to the influence of inductance or stray capacitance.

In addition, as illustrated in FIG. 2C, a filter circuit 150 is arranged at a position radially displaced from the feeding body 14 arranged in the center of the ceiling of the plasma processing chamber 10. Therefore, under the influence of the coil 151 included in the filter circuit 150, a singular point C in the plasma density distribution occurs below the position at which the filter circuit 150 is arranged, which makes it impossible to make the plasma density distribution uniform.

In contrast, in the filter circuit 50, the central axis of the coil 51 coincides with the central axis CL of the feeding body 14. The expression "The central axis of the coil 51 coincides with the central axis CL of the feeding body 14" includes not only a case in which the central axis of the coil 51 and the central axis CL of the feeding body 14 completely coincide with each other, but also a case in which the central axis of the coil 51 and the central axis CL of the feeding body 14 substantially coincide with each other. The coil 51 is located on the outer periphery of the feeding body 14 and wound around the outer periphery of the feeding body 14. One end of the coil 51 is located on the shower head 13 side and connected to a portion of the feeding body 14 between the coil 15 and the shower head 13 or connected to the shower head 13, and the other end of the coil 51 is connected to the wiring line 12. The filter circuit 50 is arranged near the feeding body 14 so as to make the distance from the feeding body 14 to the capacitor 52 as short as possible.

As a result, the wiring line 12 from the feeding body 14 to the coil 51 may be eliminated in the configuration of FIG. 2B so that the wiring line 12 to the capacitor 52 can be shorter than that in the configuration of FIG. 2A. As a result, the influence of inductance or stray capacitance is reduced, and a bias in plasma density distribution is less likely to occur.

In the configuration of FIG. 2B, the coil 51 is wound around the feeding body 14 connected to the center of the plasma processing chamber 10. Therefore, as illustrated in FIG. 2D, a singular point C of the plasma density distribution occurs below the position at which the coil 51 of the filter circuit 50 is arranged. Therefore, by providing the singular point C in the central portion of the plasma processing chamber 10, it is possible to avoid the bias of the plasma in the circumferential direction as illustrated in FIG. 2C and to make the plasma density distribution in the circumferential direction uniform. Control for the uniformity of plasma density in a radial direction is easier than control for the uniformity of plasma density in a circumferential direction. For example, a correction method to be described below and other correction methods may be used to make the plasma density in the radial direction uniform. This makes it possible to control the plasma density distribution.

In addition, FIGS. 2A to 2D, and FIG. 3 and FIGS. 4A and 4B, which will be described later, illustrate a case in which the first RF generator 31a is coupled to the conductive member 13e of the shower head 13 via the feeding body 14. However, the present disclosure is not limited thereto, and it is considered that the same effect is exhibited when the first RF generator 31a is coupled to the conductive member 111e of the substrate support 11.

[Control of Etching Rate by Coil Arrangement]

Figure 3:
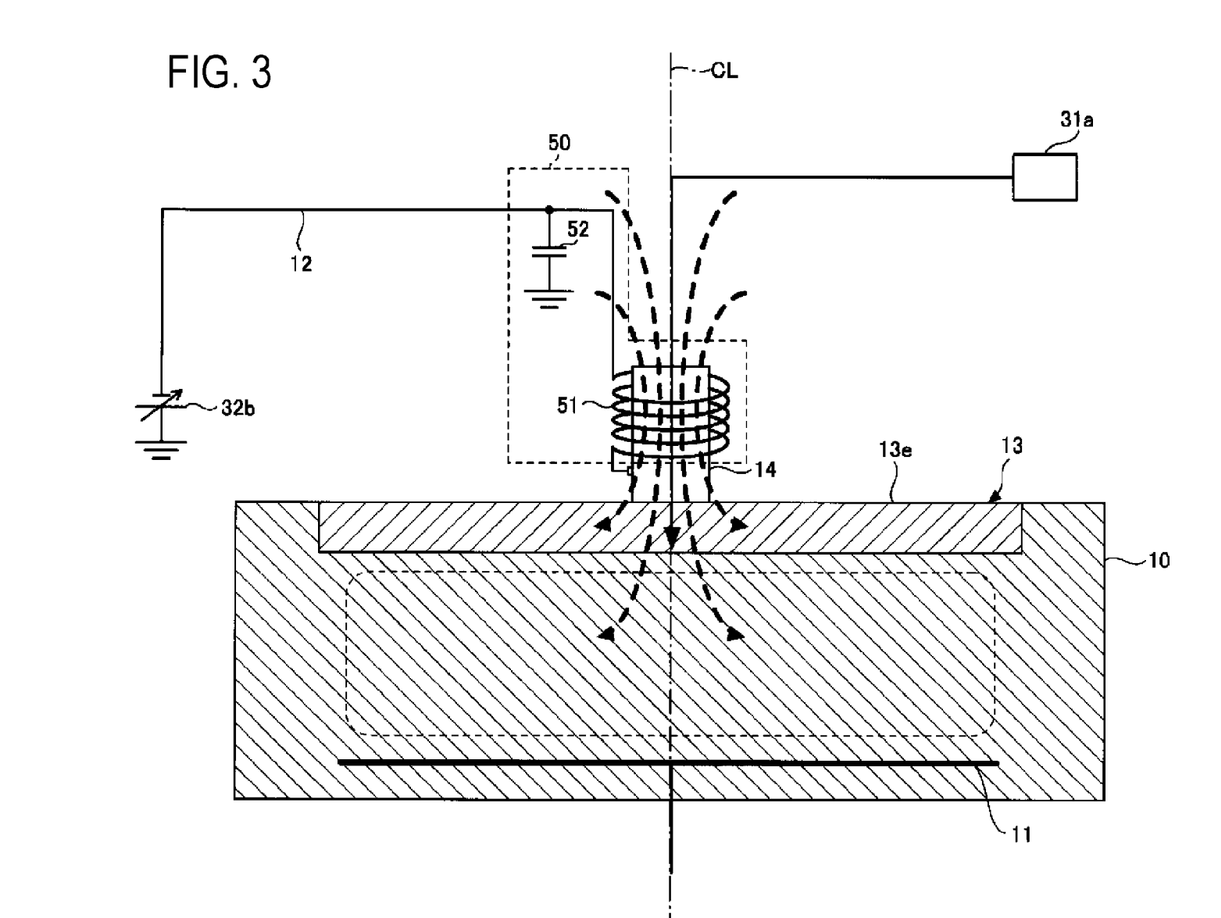
FIG. 3 is a view for describing control of an etching rate by an arrangement of a coil in an embodiment.

Next, control of the etching rate by arranging the coil 51 of the filter circuit 50 and its effect will be described with reference to FIG. 3. FIG. 3 is a view for describing control of an etching rate by an arrangement of a coil 51 in an embodiment.

The central axis of the coil 51 coincides with the central axis CL of the feeding body 14, and the coil 51 is wound to surround the periphery of the feeding body 14. Therefore, when radio frequency power having a frequency of, for example, 100 MHz, is applied from the first RF generator 31a to the feeding body 14, electromagnetic induction occurs by the radio frequency current flowing into the coil 51, and thus a magnetic field penetrating the coil 51 is generated. Due to the magnetic force strength of the generated magnetic field, the magnetic field spreads from the center to the outer peripheral side in the plasma processing space 10s. Therefore, electrons in the plasma processing space 10s perform a cyclotron motion along the magnetic field. Due to the cyclotron motion of the electrons, the plasma density becomes stronger in the outer peripheral region of the plasma processing space 10s so that the etching rate in the outer peripheral region of the plasma processing space 10s can be increased and the etching rate in the central region of the plasma processing space 10s can be decreased.

In the case in which radio frequency power for plasma generation is applied to the upper electrode, the etching rate in the central region of the plasma processing space 10s is likely to become higher than the etching rate in the outer peripheral region, compared to the case in which radio frequency power for plasma generation is applied to the lower electrode. In particular, when power having a frequency of 100 MHz or higher is applied to the upper electrode, the etching rate significantly tends to increase in the central region of the plasma processing space 10s.

Therefore, in the filter circuit 50 according to the embodiment, the coil 51 is wound around the outer periphery of the feeding body 14, and electromagnetic induction generated according to the radio frequency current flowing through the coil 51 is controlled, thereby controlling the generation of plasma. That is, control is performed such that the etching rate in the outer peripheral region of the plasma processing space 10s is increased by the action of the electromagnetic induction, and the etching rate in the central region of the plasma processing space 10s is decreased. As a result, even when power having a frequency of 100 MHz or higher is applied to the feeding body 14, it is possible to make the plasma density distribution uniform not only in the circumferential direction, but also in the radial direction so that it is possible to control the uniformity of the etching rate in the plasma processing space 10s.

When the plasma density is higher in the central region of the plasma processing space 10s than in the outer peripheral region, it is possible to make the plasma density in the radial direction uniform using another correction method such as moving the coil 51 described later with reference to FIGS. 7 and 8A and 8B. The control to make the plasma density in the radial direction uniform is easier than the control to make the plasma density in the circumferential direction uniform. Therefore, with the filter circuit 50 according to the embodiment, it is possible to eliminate a bias in plasma density distribution and to improve etching characteristics such as an etching rate. As the method for making the plasma density in the radial direction uniform, correction methods such as pressure adjustment and installation of a magnet may be used or the combination thereof may be used. In addition, the etching rate or the like may be made uniform with a gas introduction method by performing adjustment of increasing or decreasing the amount of gas to be introduced into the central region with respect to the amount of gas to be introduced into the outer peripheral region of the plasma processing space 10s according to a bias in plasma density distribution as a gas introduction method.

MODIFICATIONS

Next, modifications of the filter circuit 50 according to the embodiment will be described with reference to FIGS. 4A to 6C. FIGS. 4A to 6C are views illustrating modifications 1 to 4 of the filter circuit 50 according to the embodiment.

Modification 1

Figure 4A:
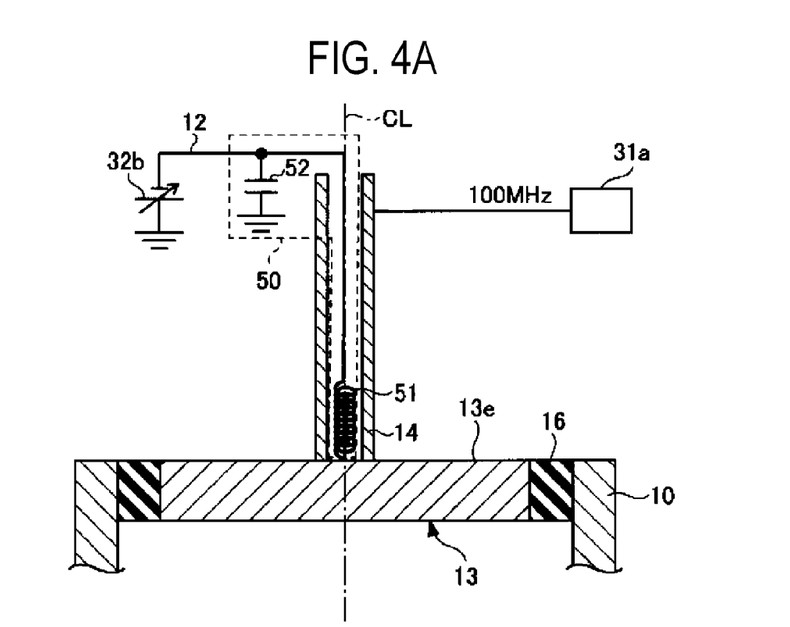
FIGS. 4A and 4B are views illustrating modifications 1 and 2 of the filter circuit according to the embodiment.

FIG. 4A is a view illustrating modification 1 of the filter circuit 50 according to the embodiment. In view of the fact that the coil 51 of the filter circuit 50 is arranged inside the feeding body 14, modification 1 differs from the configuration of the embodiment of FIGS. 2B and 3 in which the coil 51 is wound around the feeding body 14. In other configurations, modification 1 and the embodiment are the same.

Specifically, in modification 1, a cavity is formed inside the feeding body 14. The radio frequency current supplied from the first RF generator 31a flows through the surface layer of the feeding body 14 and is supplied to the shower head 13. Therefore, a cavity can be formed inside the feeding body 14. In modification 1, the coil 51 is located in the cavity inside the feeding body 14. However, the present disclosure is not limited thereto, and the coil 51 may be wound around the outer periphery of the feeding body 14 even if the cavity is formed inside the feeding body 14.

Modification 2

Figure 4B:
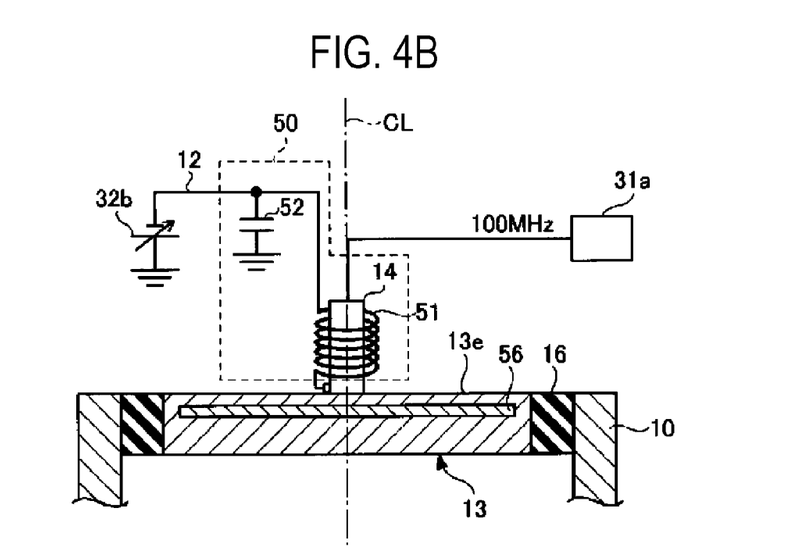

FIG. 4B is a view illustrating modification 2 of the filter circuit 50 according to the embodiment. In view of the fact that a shielding plate 56 is embedded in the shower head 13, modification 2 differs from the configuration of the embodiment in which no shielding plate 56 is present as illustrated in FIGS. 2B and 3. In other configurations, modification 2 and the embodiment are the same.

In modification 2, a shielding plate 56 for shielding a magnetic field is embedded inside the shower head 13 near the rear surface of the shower head 13 to which the feeding body 14 is connected. In modification 2 as well, the coil 51 of the filter circuit 50 is wound around the outer periphery of the feeding body 14, so that a magnetic field penetrating the coil 51 is generated by electromagnetic induction generated by the radio frequency current flowing through the coil 51.

Due to the magnetic force strength of the generated magnetic field, the magnetic field spreads from the center toward the outer peripheral side in the plasma processing space 10s. By embedding the shielding plate 56, which performs electromagnetic shielding in the shower head 13, it is possible to implement shielding such that no magnetic force reaches the shower head 13 on an opposite side of the feeding body 14 about the shielding plate 56 and the plasma processing space 10s. As a result, it is possible to control the plasma density to be uniform from the center toward the outer peripheral side by lowering the plasma density in the central region of the plasma processing space 10s.

The shielding plate 56 is preferably embedded inside the shower head 13. The radio frequency current flows on the surface of the shower head 13. Therefore, when the shielding plate 56 is arranged on the surface of the shower head 13, the shielding plate 56 becomes a resistance and thus the radio frequency current becomes difficult to flow, which lowers the efficiency of energy that contributes to plasma generation. In contrast, when the shielding plate 56 is embedded inside the shower head 13, it is possible to obtain a magnetic shielding effect of absorbing magnetic flux without obstructing the flow of the radio frequency current in the shower head 13 by the shielding plate 56.

The shielding plate 56 is preferably made of a material having a high magnetic permeability and a low resistance value so as to prevent heat generation. For example, the shielding plate 56 may be formed of a soft magnetic metal material such as permalloy, directional silicon steel, or Sendust, or a soft magnetic electronic ceramic material such as ferrite.

As the feeding body 14, a material such as aluminum having a low magnetic permeability and a low resistance value is preferable. As a result, the magnetic force formed by the electromagnetic induction in the coil 51 can be spread to the outer peripheral side of the feeding body 14 without being concentrated on the feeding body 14 side.

Modification 3

Figure 5:
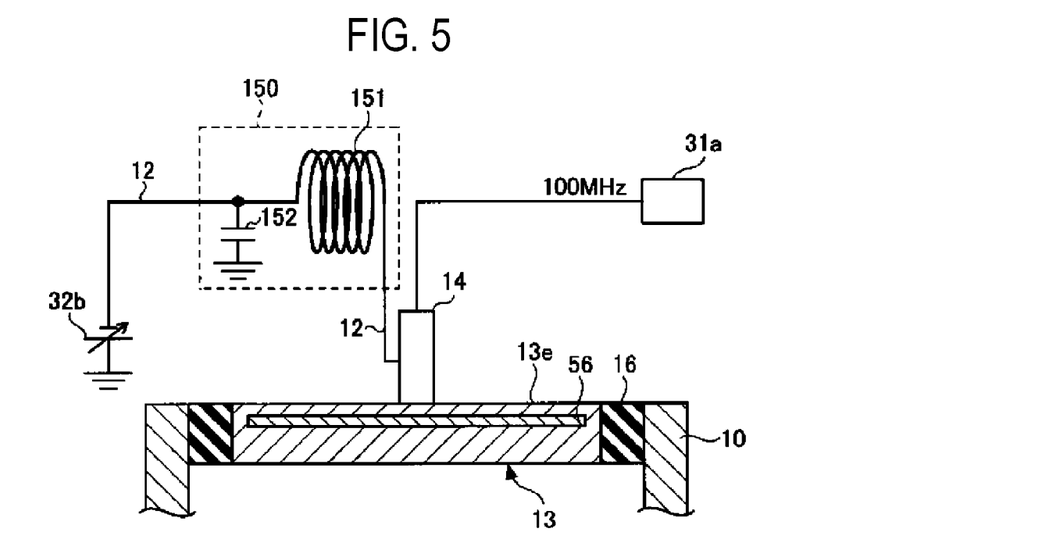
FIG. 5 is a view illustrating modification 3 of the shielding plate according to the embodiment.

As illustrated in FIG. 5, the shielding plate 56 may be embedded inside the shower head 13 in the configuration illustrated in FIG. 2A. A magnetic field is generated toward the plasma processing space 10s due to the magnetic force strength of the magnetic field generated by the coil 151 included in the filter circuit 150. However, by embedding the shielding plate 56 that performs electromagnetic shielding in the shower head 13, it is possible to implement shielding such that no magnetic force reaches the shower head 13 on an opposite side of the feeding body 14 about the shielding plate and the plasma processing space 10s. As a result, it is possible to control the plasma density to be uniform by suppressing the singular point C of the plasma density distribution below the position at which the filter circuit 150 is arranged.

Modification 4

Figure 6A:
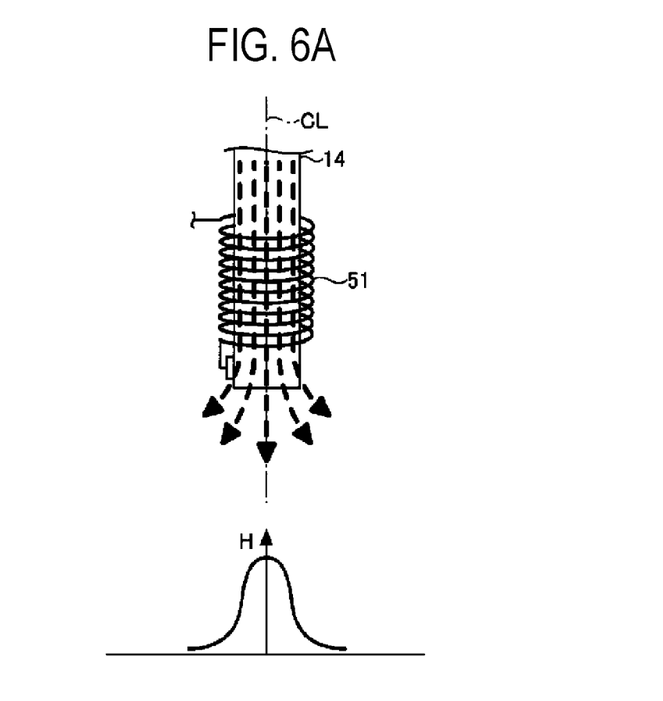
FIGS. 6A to 6C are views illustrating modification 4 of the filter circuit according to the embodiment.
Figure 6B:
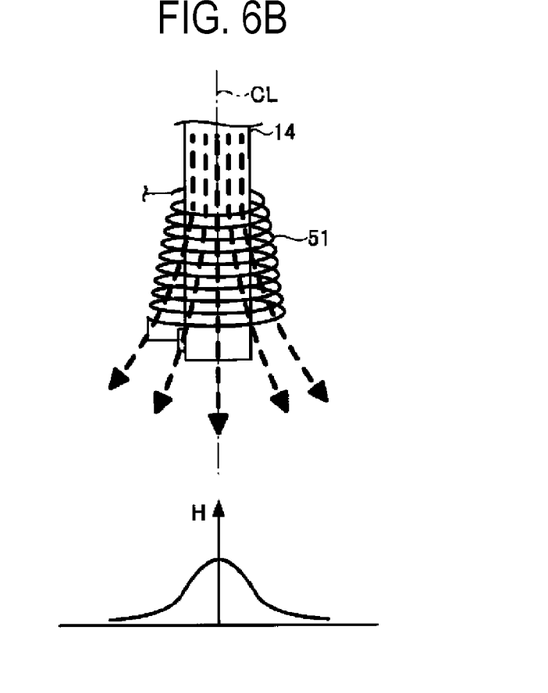
Figure 6C:
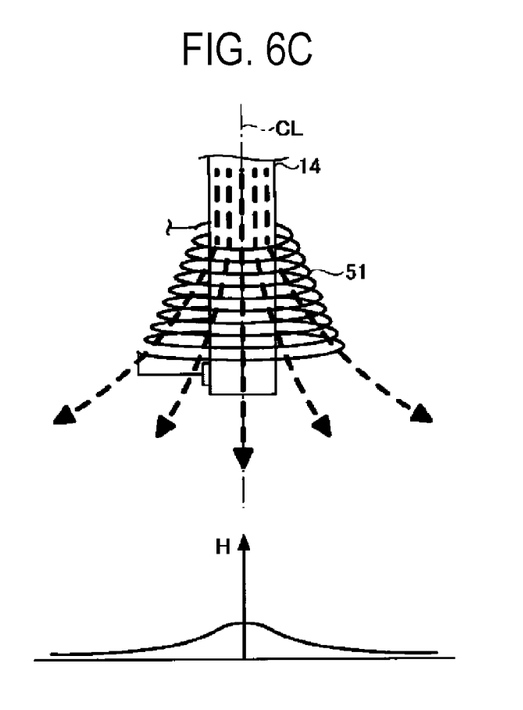

FIG. 6A is a diagram illustrating the coil 51 of the filter circuit 50 according to the embodiment. In contrast, FIGS. 6B and 6C are views illustrating modification 4 of the filter circuit 50 according to the embodiment. In Modification 4, the coil 51 differs from the coil 51 according to the embodiment illustrated in FIG. 6A in that it is configured to be widened downward with respect to the central axis CL of the feeding body 14. That is, in modification 4, the coil 51 is configured to be widened toward the shower head 13. In other configurations, modification 4 and the embodiment are the same.

In Modification 4, as illustrated in FIGS. 6B and 6C, the diameter of the coil 51 wound around the feeding body 14 becomes larger with respect to the central axis CL of the feeding body 14 downward, so the coil 51 spreads in a trumpet shape. In FIG. 6C, the diameter of the coil 51 is the same as that of FIG. 6B at the upper portion of the coil 51, but the diameter of the coil 51 is further larger than that of FIG. 6B at the lower portion.

According to this, as illustrated in the lower graphs of FIGS. 6A to 6C, when the coil 51 having any shape of FIGS. 6A to 6C is arranged on the feeding body 14, the magnetic field H is the strongest at the central axis CL of the feeding body 14, and spreads toward the outer peripheral side. In the shape of the coil 51 of FIG. 6B, compared to the shape of the coil 51 of FIG. 6A, the strength of the magnetic field H at the central axis CL of the feeding body 14 is weaker, and the magnetic field H more widely spreads toward the outer peripheral side. In the shape of the coil 51 of FIG. 6C, compared to the shape of the coil 51 of FIG. 6B, the strength of the magnetic field H at the central axis CL of the feeding body 14 is further weaker, and the magnetic field H further more widely spreads toward the outer peripheral side. That is, by shaping the coil 51 in a trumpet shape such that the lower portion on the shower head 13 side is larger than the upper portion, the magnetic field in the central region of the plasma processing space 10s can be weakened. This makes it possible to alleviate a local increase in etching rate in the central region of the plasma processing space 10s.

[Coil Driving Method]

Hereinafter, a method of driving a coil 51 for controlling a plasma density distribution by moving the coil 51 to make a plasma density uniform will be described with reference to FIGS. 7 and 8A and 8B. In the coil driving method illustrated in FIGS. 7 and 8A and 8B, any of the coils 51 of the filter circuits 50 according to the embodiment and each modification can be used. In this case, the coil 51 is moved along the central axis CL of the feeding body 14.

(Coil Driving Method 1)

Figure 7:
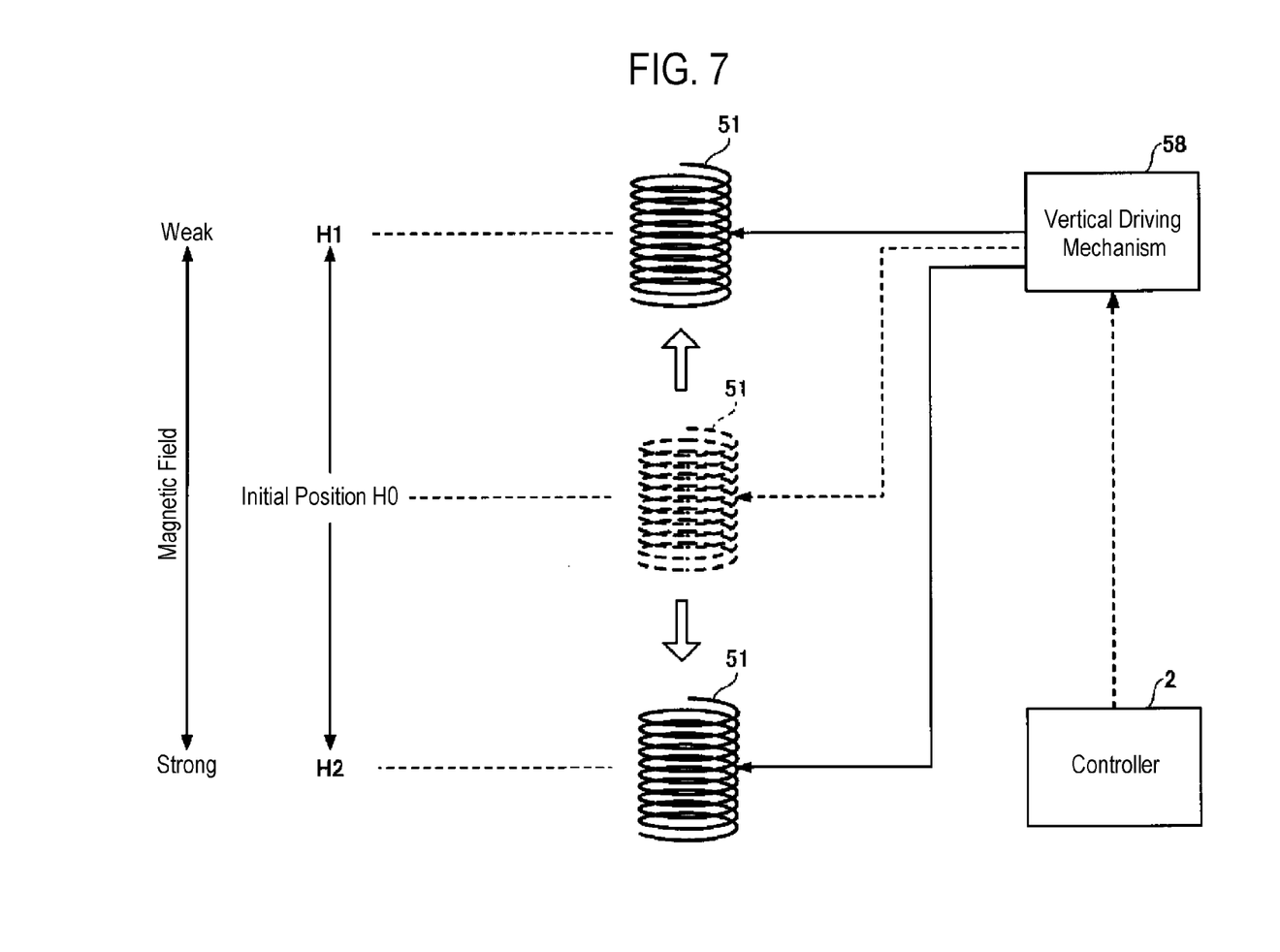
FIG. 7 is a view illustrating coil driving method 1 of driving a filter circuit according to the embodiment.

FIG. 7 is a view illustrating coil driving method 1 of driving a coil 51. In coil driving method 1, the coil 51 is connected to a vertical driving mechanism 58 and is movable upward and downward in the height direction of the coil 51 by the vertical driving mechanism 58.

The controller 2 controls the position (height) of the coil 51 using the vertical driving mechanism 58. For example, as illustrated in FIG. 7, the controller 2 may control the position of the coil 51 to be raised from the initial position H0 of the coil 51 to a position H1 (H1>H0) using the vertical driving mechanism 58. As a result, the magnetic field reaching the plasma processing space 10s under the coil 51 can be weakened, and the electric field in the plasma processing space 10s under the coil 51 can be weakened.

Meanwhile, the controller 2 may control the position of the coil 51 to be lowered from the initial position H0 of the coil 51 to a position H2 (H2<H0) using the vertical driving mechanism 58. As a result, the magnetic field reaching the plasma processing space 10s under the coil 51 can be strengthened, and the electric field in the plasma processing space 10s under the coil 51 can be strengthened. As a result, the plasma density distribution in the plasma processing space 10s under the coil 51 can be controlled, and the controllability of the etching rate in the central region of the plasma processing space 10s can be improved.

(Coil Driving Method 2)

Figure 8A:
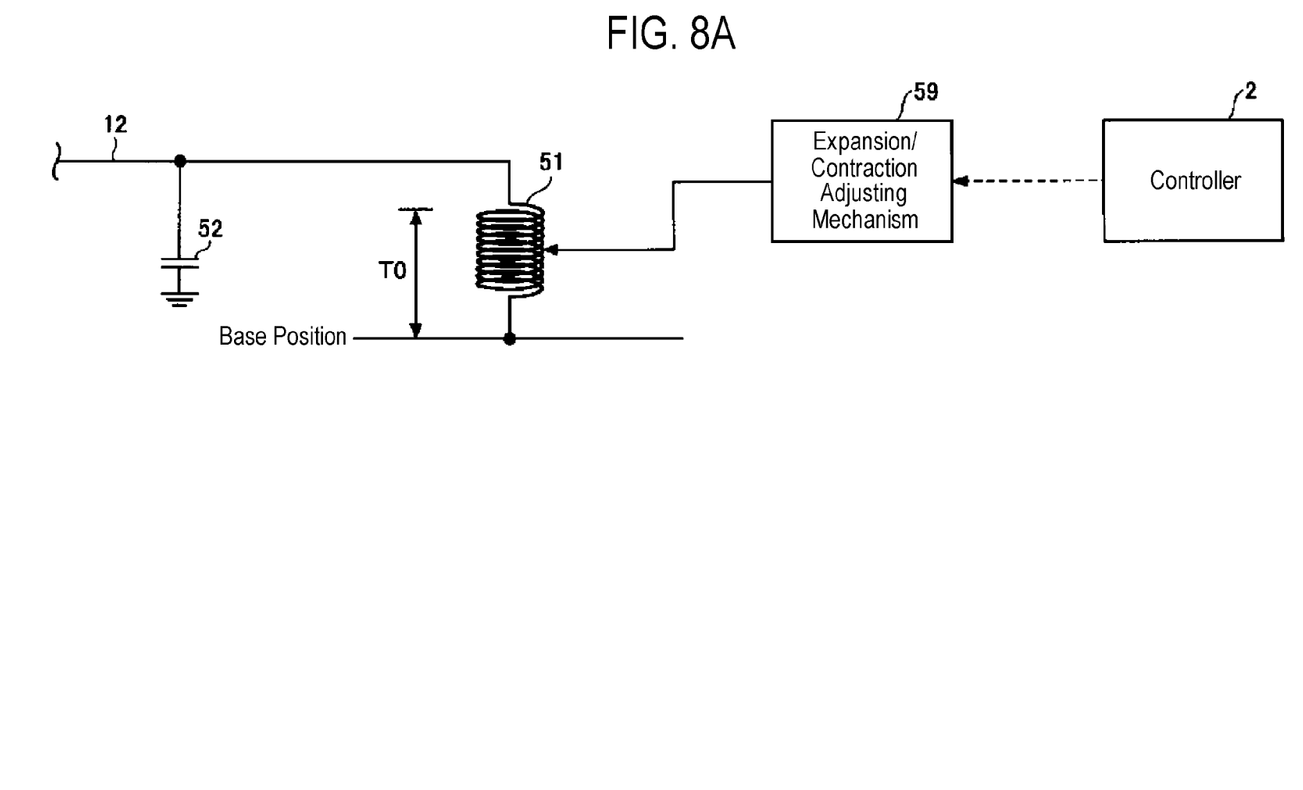
FIGS. 8A and 8B are views illustrating coil driving method 2 of driving a filter circuit according to the embodiment.
Figure 8B:
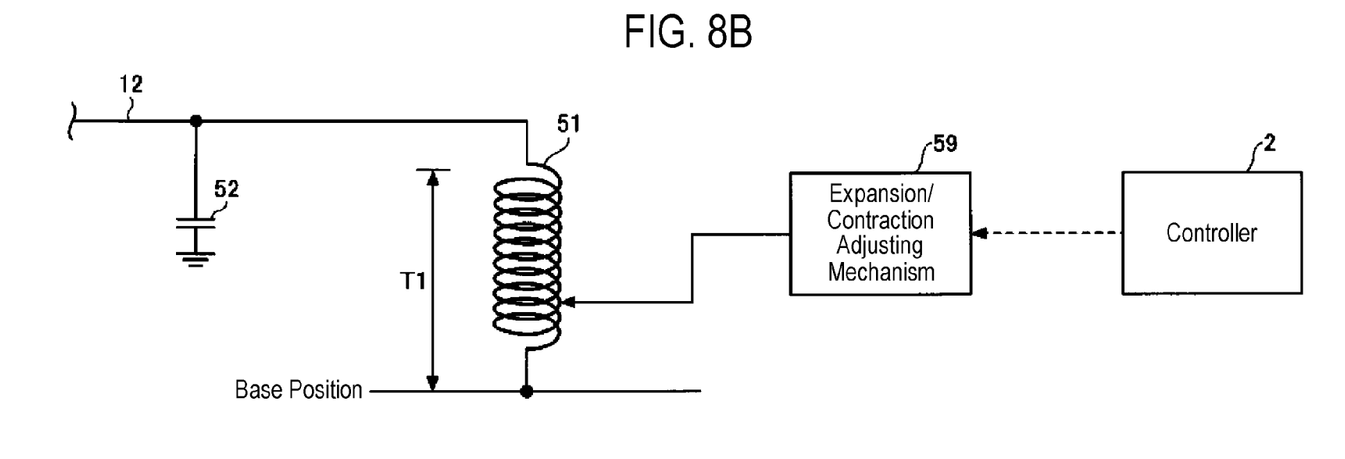

FIGS. 8A and 8B are views illustrating coil driving method 2 of driving a coil 51. In coil driving method 2, the coil 51 is connected to an expansion/contraction adjusting mechanism 59 and can be expanded/contracted along the central axis CL of the feeding body 14 by the expansion/contraction adjusting mechanism 59.

The controller 2 controls the length of the coil 51 using the expansion/contraction adjusting mechanism 59. For example, the coil 51 may be fixed at a base position. As illustrated in FIGS. 8A and 8B, the controller 2 may control the length of the coil 51 to a length T1 (T1>T0) expanded from the initial length T0 using the expansion/contraction adjusting mechanism 59. By controlling the length of the coil 51 to expand/contract from the initial length T0 of the coil 51 in this way, the strength of the magnetic field in the plasma processing space 10s under the coil 51 can be changed. As a result, the electric field distribution in the plasma processing space 10s under the coil 51 can be changed, and the plasma density can be controlled so that the controllability of the etching rate in the central region of the plasma processing space 10s can be improved.

However, by expanding/contracting the coil 51, the inductance of the filter circuit 50 is changed. Therefore, when the coil 51 is expanded/contracted, the function as the filter circuit 50 can be maintained by changing the conductance by operating the capacitor 52 of the filter circuit 50 according to the change in the inductance.

In FIG. 3, a mechanism capable of controlling a plasma density distribution in the central region and outer peripheral region of the plasma processing space 10s by winding a coil 51 around a feeding body 14 and controlling generation of plasma by electromagnetic induction generated by a radio frequency current flowing through the coil 51 has been described. In contrast, according to the coil driving methods 1 and 2 of driving the coil 51, the plasma density distribution can be further controlled by moving the coil 51. The coil 51 may be driven by combining the vertical driving mechanism 58 and the expansion/contraction adjusting mechanism 59.

As described above, with the plasma processing apparatus 1 including the filter circuit 50 according to the embodiment and each modification, it is possible to eliminate a bias in plasma density distribution and to improve etching characteristics.

In the foregoing description, according to the embodiment and each modification, the coil 51 constituting the filter circuit 50 is wound around the feeding body 14, and the capacitor 52 constituting the filter circuit 50 is provided in the wiring line 12 that connects the second DC generator 32b and the feeding body 14 to each other. However, the installation of the coil 51 and the capacitor 52 of the filter circuit 50 is not limited to this.

The coil 51 of the filter circuit 50 may be wound around the feeding body on the rear surface of the conductive member 111e of the substrate support 11. Specifically, the coil 51 of the filter circuit 50 may be wound around a feeding body connected to the central portion of the rear surface of the conductive member 111e of the substrate support 11, and radio frequency power as a source RF signal may be applied from the first RF generator 31a to the substrate support 11. In this case, the capacitor 52 of the filter circuit 50 may be connected between the wiring line that connects the feeding body connected to the central portion of the rear surface of the conductive member 111e and the first DC generator 32a to each other and the ground so as to form a series resonance circuit. Alternatively, the capacitor 52 of the filter circuit 50 may be connected between the wiring line that connects the feeding body connected to the central portion of the rear surface of the conductive member 111e and the second RF generator 31b to each other and the ground so as to form a series resonance circuit. The second RF generator 31b supplies power having a frequency of less than 400 kHz.

It shall be understood that the filter circuits and the plasma processing apparatuses according to the embodiments disclosed herein are exemplary in all respects and are not restrictive. The embodiments can be modified and improved in various forms without departing from the scope and spirit of the appended claims. The matters described in multiple embodiments described above may take other configurations without contradiction, and may be combined without contradiction.

The plasma processing apparatus of the present disclosure is applicable to any of an atomic layer deposition (ALD) type apparatus, a capacitively coupled plasma (CCP) type apparatus, an inductively coupled plasma (ICP) type apparatus, a radial line slot antenna (RLSA) type apparatus, an electron cyclotron resonance plasma (ECRP) type apparatus, and a helicon wave plasma (HWP) type apparatus.

Furthermore, the plasma processing apparatus is applicable not only to an etching apparatus, but also to an apparatus such as a film forming apparatus or an ashing apparatus as long as the apparatus is an apparatus for performing predetermined plasma processing on a substrate.

According to an aspect, it is possible to eliminate a bias in plasma density distribution and to improve etching characteristics.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A radio frequency power filter circuit used in a plasma processing apparatus that includes an electrode and a feeding body connected to a center of a rear surface of the electrode and generates plasma by applying radio frequency power, the filter circuit comprising:
   a series resonance circuit provided in a wiring line between a conductive member provided in the plasma processing apparatus and a power supply configured to supply DC power or power having a frequency of less than 400 kHz to the conductive member, and including a coil connected in series to the wiring line and a capacitor connected between the wiring line and a ground,
   wherein a central axis of the coil and a central axis of the feeding body coincide with each other.

2. The filter circuit of claim 1, wherein one end of the coil is connected to the feeding body between the coil and the electrode or connected to the electrode.

3. The filter circuit of claim 2, wherein the coil is located at an outer periphery of the feeding body.

4. The filter circuit of claim 3, wherein radio frequency power having a frequency of 400 kHz or higher is applied to the electrode via the feeding body.

5. The filter circuit of claim 4, wherein the coil is configured to be widened toward the electrode side with respect to the central axis of the feeding body.

6. The filter circuit of claim 5, wherein a shielding plate configured to shield a magnetic field is embedded inside the electrode and below a rear surface of the electrode to which the feeding body is connected.

7. The filter circuit of claim 6, wherein the coil is configured to move along the central axis of the feeding body.

8. The filter circuit of claim 7, wherein the coil is connected to a vertical driving mechanism to be movable upward and downward in a height direction of the coil by the vertical driving mechanism.

9. The filter circuit of claim 8, wherein the coil is connected to an expansion/contraction adjusting mechanism to be expandable/contractible by the expansion/contraction adjusting mechanism.

10. The filter circuit of claim 1, wherein the coil is located at an outer periphery of the feeding body.

11. The filter circuit of claim 1, wherein the feeding body includes a cavity therein, and the coil is located inside the cavity.

12. The filter circuit of claim 1, wherein radio frequency power having a frequency of 400 kHz or higher is applied to the electrode via the feeding body.

13. The filter circuit of claim 1, wherein the coil is configured to be widened toward the electrode side with respect to the central axis of the feeding body.

14. The filter circuit of claim 1, wherein a shielding plate configured to shield a magnetic field is embedded inside the electrode and below a rear surface of the electrode to which the feeding body is connected.

15. The filter circuit of claim 1, wherein the coil is configured to move along the central axis of the feeding body.

16. The filter circuit of claim 1, wherein the coil is connected to a vertical driving mechanism to be movable upward and downward in a height direction of the coil by the vertical driving mechanism.

17. The filter circuit of claim 1, wherein the coil is connected to an expansion/contraction adjusting mechanism to be expandable/contractible by the expansion/contraction adjusting mechanism.

18. A plasma processing apparatus of generating plasma by applying radio frequency power, the plasma processing apparatus comprising:
an electrode;
a feeding body connected to a center of a rear surface of the electrode; and
a radio frequency power filter circuit,
wherein the filter circuit comprises:
a series resonance circuit provided in a wiring line between a conductive member provided in the plasma processing apparatus and a power supply configured to supply DC power or power having a frequency of less than 400 kHz to the conductive member, and including a coil connected in series to the wiring line and a capacitor connected between the wiring line and a ground,
wherein a central axis of the coil and a central axis of the feeding body coincide with each other.

19. A plasma processing apparatus comprising:
an electrode;
a feeding body connected to a center of a rear surface of the electrode; and
a radio frequency power filter circuit,
wherein the radio frequency power is applied to the electrode via the feeding body, and a shielding plate configured to shield a magnetic field is embedded inside the electrode and below a rear surface of the electrode to which the feeding body is connected.

* * * * *